(12) United States Patent
Luo et al.

(10) Patent No.: US 10,032,832 B2
(45) Date of Patent: Jul. 24, 2018

(54) ORGANIC LIGHT-ENITTING DIODE DISPLAY PANEL FOR FINGERPRINT RECOGNITION AND ELECTRONIC DEVICE

(71) Applicant: NANCHANG O-FILM BIO-IDENTIFICATION TECHNOLOGY CO., LTD., Nanchang (CN)

(72) Inventors: Jianfeng Luo, Nanchang (CN); Saixin Guan, Nanchang (CN)

(73) Assignee: NANCHANG O-FILM BIO-IDENTIFICATION TECHNOLOGY CO., LTD., Nanchang (CN)

( * ) Notice: Subject to any disclaimer, the term of this patent is extended or adjusted under 35 U.S.C. 154(b) by 0 days.

(21) Appl. No.: 15/585,024

(22) Filed: May 2, 2017

(65) Prior Publication Data
US 2018/0151639 A1    May 31, 2018

(30) Foreign Application Priority Data
Nov. 28, 2016    (CN) .......................... 2016 1 1072545

(51) Int. Cl.
  *H01L 51/50*    (2006.01)
  *H01L 27/32*    (2006.01)
  *G06K 9/00*    (2006.01)
(52) U.S. Cl.
  CPC ........ *H01L 27/3227* (2013.01); *G06K 9/0004* (2013.01); *H01L 27/3218* (2013.01)

(58) Field of Classification Search
  CPC . H01L 27/3227; H01L 27/3218; H01L 51/00; H01L 27/3241–51/3297; H01L 51/0032–51/0095; H01L 51/0508–51/057; H01L 51/42–51/448; G06K 9/0004
  See application file for complete search history.

(56) References Cited

U.S. PATENT DOCUMENTS

2010/0007616 A1*   1/2010  Jang .................. G06F 3/0412
                                                         345/173
2015/0331508 A1*  11/2015  Nho .................. G06F 3/0421
                                                         345/173

* cited by examiner

*Primary Examiner* — Selim Ahmed
(74) *Attorney, Agent, or Firm* — Platinum Intellectual Property LLP

(57) ABSTRACT

An organic light-emitting diode display panel for fingerprint recognition includes a plurality of pixel areas arranged in arrays, the pixel area includes a pixel unit and a fingerprint recognition unit, which are adjacent to each other, the pixel unit is configured to emit colorful image light, the fingerprint recognition unit comprises a sensing light emitting module and a sensing light receiving module, the sensing light emitting module is configured to emit sensing light to a finger, and the sensing light receiving module is configured to receive the sensing light reflected by the finger and convert a light signal of the sensing light into an electric signal. An electronic device is also provided.

18 Claims, 5 Drawing Sheets

ORGANIC LIGHT-ENITTING DIODE DISPLAY PANEL FOR FINGERPRINT RECOGNITION AND ELECTRONIC DEVICE

CROSS REFERENCE TO RELATED APPLICATION

This application claims priority to Chinese Patent Application No. 201611072545.9, entitled "ORGANIC LIGHT-EMITTING DIODE DISPLAY SCREEN FINGERPRINT RECOGNITION EQUIPMENT AND ELECTRONIC DEVICE" filed on Nov. 28, 2016, the contents of which are expressly incorporated by reference herein in its entirety.

FIELD OF THE INVENTION

The present disclosure relates to the field of display technology, and more particularly relates to an organic light-emitting diode (OLED) display panel for fingerprint recognition and an electronic device having the same.

BACKGROUND OF THE INVENTION

The OLED display device has advantages of high luminous efficiency, fast response time, being more flexible, producing light without backlight, thus being applied widely. At the same time, with the rise of the fingerprint recognition technology, the developers begin to research how to apply the fingerprint recognition technology to the OLED display device, so as to enhance safety and operability thereof.

A conventional capacitance fingerprint sensing device is separately arranged for fingerprint recognition in non-display area of the OLED display device. The capacitance fingerprint sensing device has a complicated structure needed to be disposed in non-display area of the display device, which enlarges the non-display area and has an influence on the overall structure of the display device, and OLED display technology cannot integrate with the fingerprint recognition technology to achieve the full-screen fingerprint recognition.

SUMMARY

The present disclosure is directed to an OLED display panel for fingerprint recognition and an electronic device.

The OLED display panel includes a plurality of sub-pixel units arranged in arrays, the plurality of sub-pixel units are configured to emit blue, green, and red monochromatic light, which are combined to form a colorful image, three adjacent sub-pixel units are sequentially arranged to form a pixel area; in each pixel area, the sub-pixel units emit the monochromatic light of different colors, respectively, and at least one sub-pixel unit includes a displaying module and a light receiving module, the displaying module is configured to emit the monochromatic light, and the light receiving module is configured to receive the monochromatic light reflected by a finger and convert a light signal of the monochromatic light into an electric signal.

The electronic device includes the OLED display panel and a motherboard electrically coupled to the OLED display panel, and the motherboard is configured to control the pixel area to display image and process the electric signal.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. The accompanying drawings in the following description are only some embodiments of the present invention, and persons of ordinary skill in the art can derive other obvious variations from the accompanying drawings without creative efforts.

DETAILED DESCRIPTION OF THE EMBODIMENTS

The accompanying drawings according to the embodiments of the present disclosure will be described in the following to illustrate the technical solutions according to the embodiments of the present disclosure more clearly and completely. The described implementations are merely specific embodiments of the present disclosure, and any implementations derived from the foregoing implementations without creative efforts by persons skilled in the art shall all fall within the protection scope of the present disclosure.

Figure 1:
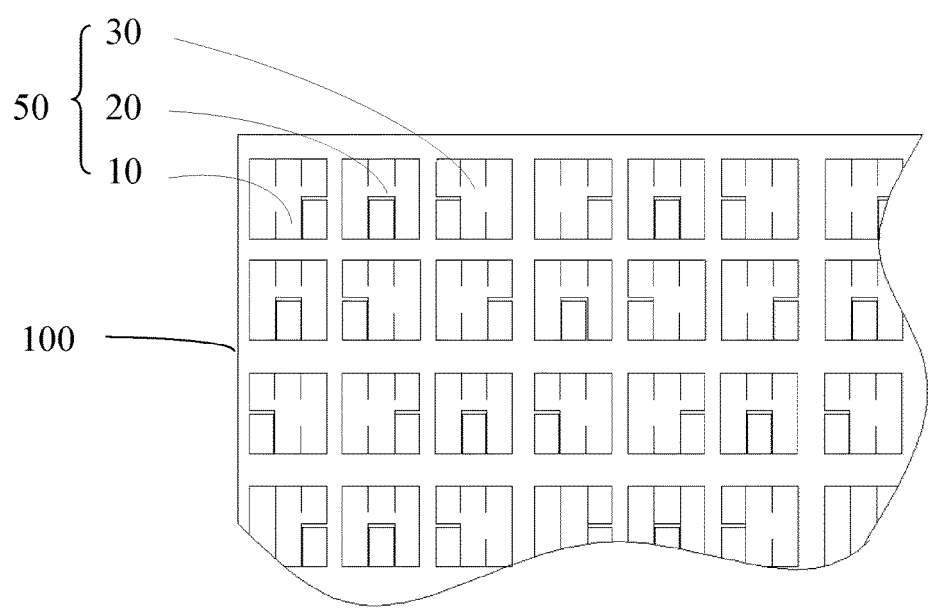
FIG. 1 is a top view of an OLED display panel according to an embodiment.

Referring to FIG. 1, an OLED display panel 100 according to an embodiment includes a plurality of pixel areas 50 arranged in arrays. Each pixel area 50 includes a first pixel area 10, a second pixel area 20, and a third pixel area 30.

Figure 2:
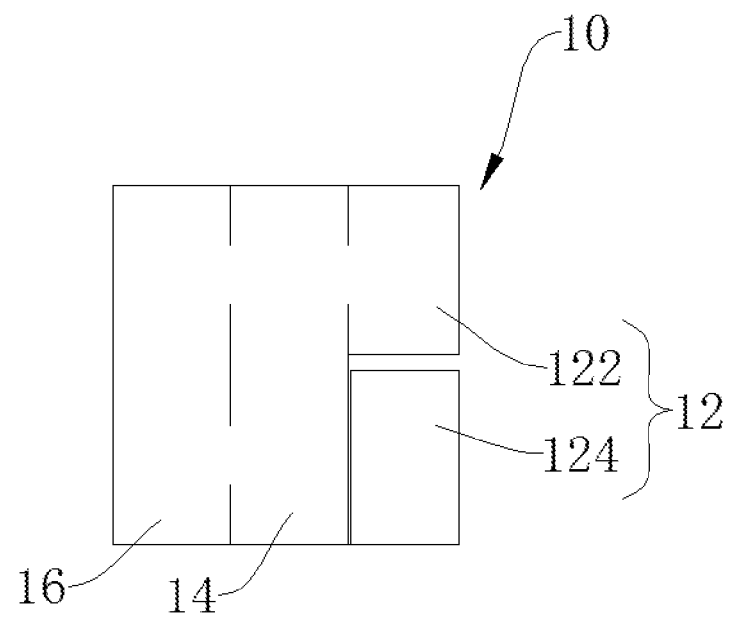
FIG. 2 is an enlarged, top view of the first pixel area of FIG. 1.
Figure 4:
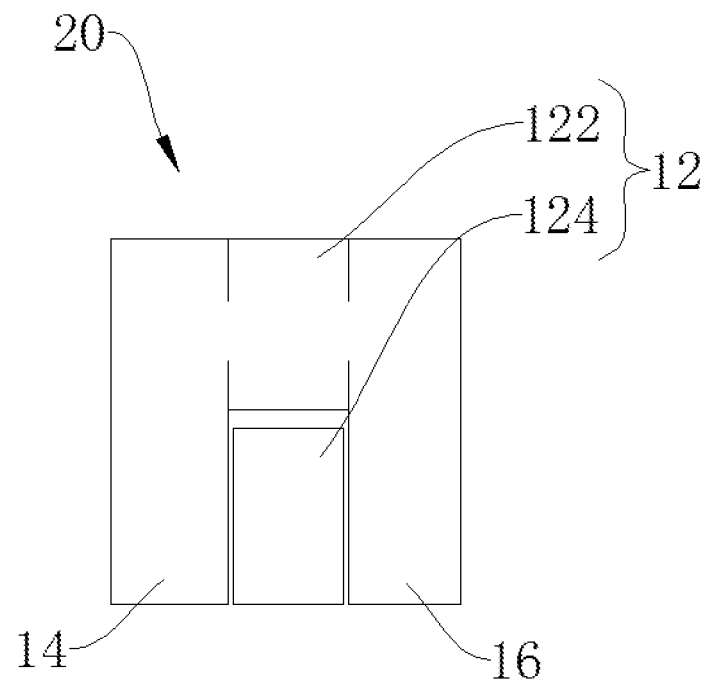
FIG. 4 is an enlarged, top view of the second pixel area of FIG. 1.
Figure 6:
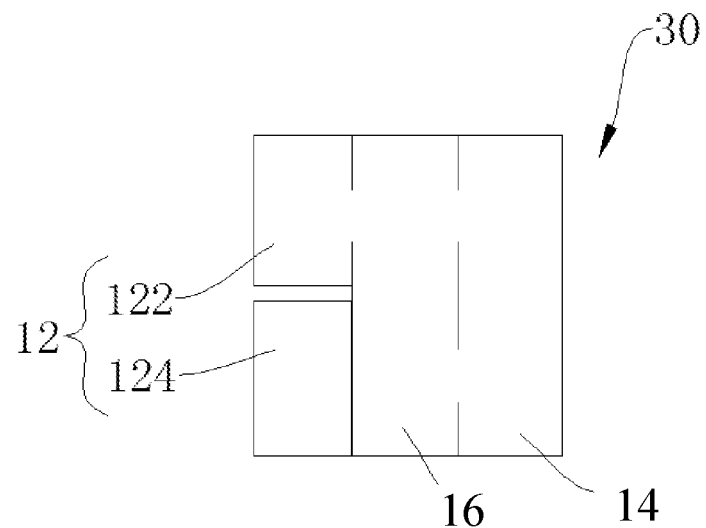
FIG. 6 is an enlarged, top view of the third pixel area of FIG. 1.

Referring to FIGS. 2, 4, and 6, each of the first pixel area 10, the second pixel area 20, and a third pixel area 30 includes a first sub-pixel unit 12, a second sub-pixel unit 14, and a third sub-pixel unit 16, which are adjacent to each other. The sub-pixel units 12, 14, and 16 can emit blue, green and red monochromatic light, respectively, which are combined to form colorful images.

In the illustrated embodiment, the first sub-pixel unit 12, the second sub-pixel unit 14, and the third sub-pixel unit 16 are shaped as rectangles of the same size. In an alternative embodiment, they can have other shapes, such as round, square and so on. In each pixel area 50, the sub-pixel units 12, 14, and 16 emit the monochromatic light of different colors, respectively.

Referring to FIG. 2, the first sub-pixel unit 12 includes a displaying module 122 and a light receiving module 124.

The displaying module 122 is used to emit the monochromatic light, and the light receiving module 124 is used to receive the monochromatic light reflected by a finger and convert a light signal of the monochromatic light into an electric signal. The displaying module 122, the second sub-pixel unit 14, and the third sub-pixel unit 16 are used to emit monochromatic light of different colors, such as red, green or blue, so as to enable the monochromatic light to be combined to form a colorful image. On the one hand, each monochromatic light forms the colorful image directly and send it to the user on the device. On the other hand, when the user presses or covers the display panel with the finger, partial monochromatic light is blocked from reaching the user's eyes, which instead is reflected by the finger. The light receiving module 124 receives the monochromatic light reflected by the finger and converts a light signal of the monochromatic light into an electric signal. Since the valley and the ridge of fingerprint have different reflection characteristics of light, the light intensity reflected into the light receiving module 124 corresponding to the valley and ridge of fingerprint is different, therefore the light receiving module 124 generates different current.

On one aspect, the pixel area 50 can emit light to display the image, on the other aspect, the light reflected by the finger is received by the light receiving module 124, thereby achieving recognition of the fingerprint using optical fingerprint recognition technology. The OLED display technology is integrated with the fingerprint recognition technology. A plurality of pixel areas 50 are arranged to form the OLED display panel 100 to achieve the full-screen fingerprint recognition, the structure of which is simple and the fingerprint recognition is accurate, which satisfies the requirement of full-screen fingerprint recognition of the OLED display panel 100.

In one embodiment, in the first pixel area 10, the displaying module 122 emits the red monochromatic light, the remaining pixel units emit the blue or green monochromatic light, respectively. i.e., the first sub-pixel unit 12 emits the red monochromatic light, and the second sub-pixel unit 14 and the third sub-pixel unit 16 emit the green or blue monochromatic light, respectively.

In one embodiment, in the second pixel area 20, the displaying module 122 emits the green monochromatic light, the remaining pixel units emit the blue or red monochromatic light, respectively. i.e., the first sub-pixel unit 12 emits the green monochromatic light, and the second sub-pixel unit 14 and the third sub-pixel unit 16 emit the red or blue monochromatic light, respectively.

In one embodiment, in the third pixel area 30, the displaying module 122 emits the blue monochromatic light, the remaining pixel units emit the red or green monochromatic light, respectively. i.e., the first sub-pixel unit 12 emits the blue monochromatic light, and the second sub-pixel unit 14 and the third sub-pixel unit 16 emit the green or red monochromatic light, respectively.

In one embodiment, a displaying area of the displaying module 122 is less than the displaying areas of the second sub-pixel unit 14 and the third sub-pixel unit 16. i.e., the intensity of the monochromatic light emitted from the displaying module 122 is weaker than that of the remaining sub-pixel units. In order to avoid the color cast phenomenon of the OLED display panel 100 resulted from some of the monochromatic light of the weaker intensity, in one embodiment, the displaying module 122 of the first pixel area 10 emits the red monochromatic light, and the intensity of which is weaker than that of the blue and green monochromatic light. The displaying module 122 of the second pixel area 20 emits the green monochromatic light, and the intensity of which is weaker than that of the red and blue monochromatic light. The displaying module 122 of the third pixel area 30 emits the blue monochromatic light, and the intensity of which is weaker than that of the green and red monochromatic light. The first pixel area 10, the second pixel area 20, and the third pixel area 30 work simultaneously, and the number of which are the same. So as to enable the red, green and blue monochromatic light to have accordant intensity and the display panel 100 to show the colorful image of uniform color.

In the illustrated embodiment, in each pixel area 50, the first pixel area 10, the second pixel area 20, and the third pixel area 30 are sequentially and alternately arranged. Due to the weaker monochromatic light emitted from the first pixel area 10, the second pixel area 20, and the third pixel area 30 is different, and the first pixel area 10, the second pixel area 20, and the third pixel area 30 are sequentially and alternatively arranged. So as to enable the red, green and blue monochromatic light emitted from each parts of the display panel 100 to have accordant intensity, thereby showing the colorful image of uniform color.

Specifically, as shown in FIG. 1, in each pixel area 50, each first pixel area 10 is surrounded by two second pixel areas 20 and two third pixel areas 30, each second pixel area 20 is surrounded by two first pixel areas 10 and two third pixel areas 30, and each third pixel area 30 is surrounded by two first pixel areas 10 and two second pixel areas 20. So as to enable the red, green and blue monochromatic light emitted from each parts of the display panel 100 to have accordant intensity, thereby showing the colorful image of uniform color.

In an alternative embodiment, in the first pixel area 10, the second pixel area and the third pixel area 30, three sub-pixel units are sequentially arranged to emit the red, green, and blue monochromatic light, respectively. The sequence of the sub-pixel units of each pixel area is limited. Specifically, in the first pixel area 10, the first sub-pixel unit 12, the second sub-pixel unit 14, and the third sub-pixel unit 16 are sequentially arranged from right to left. Moreover, the first sub-pixel unit 12 emits the red monochromatic light, the second sub-pixel unit 14 emits the green monochromatic light, and the third sub-pixel unit 16 emits the blue monochromatic light. In the second pixel area 20, the second sub-pixel unit 14, the first sub-pixel unit 12, and the third sub-pixel unit 16 are sequentially arranged from right to left. Moreover, the first sub-pixel unit 12 emits the red monochromatic light, the second sub-pixel unit 14 emits the green monochromatic light, and the third sub-pixel unit 16 emits the blue monochromatic light. In the third pixel area 30, the second sub-pixel unit 14, the third sub-pixel unit 16, and the first sub-pixel unit 12 are sequentially arranged from right to left. Moreover, the first sub-pixel unit 12 emits the red monochromatic light, the second sub-pixel unit 14 emits the green monochromatic light, and the third sub-pixel unit 16 emits the blue monochromatic light. The red, green and blue monochromatic light emitted from each parts of the display panel 100 to have accordant intensity, thereby showing the colorful image of uniform color.

Figure 3:
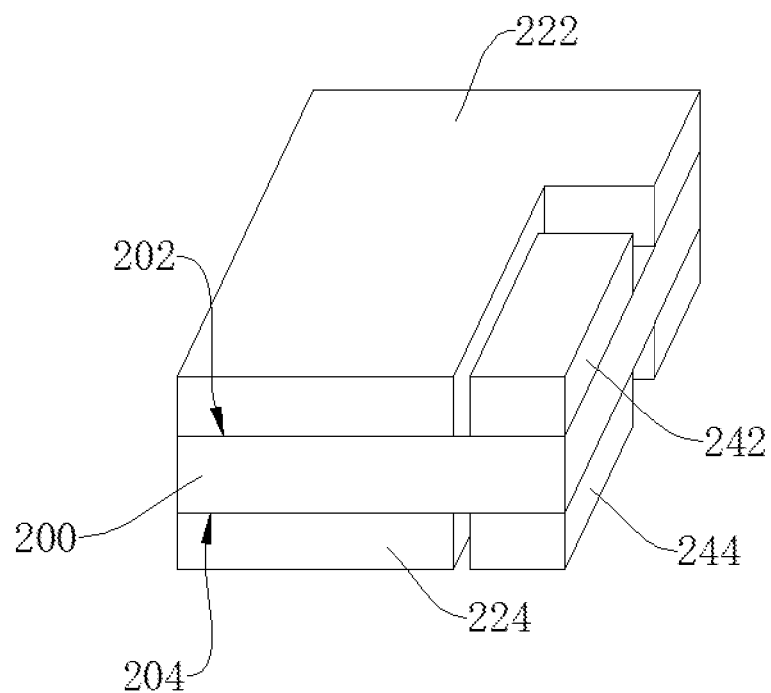
FIG. 3 is a perspective view of the first pixel area of FIG. 2.
Figure 5:
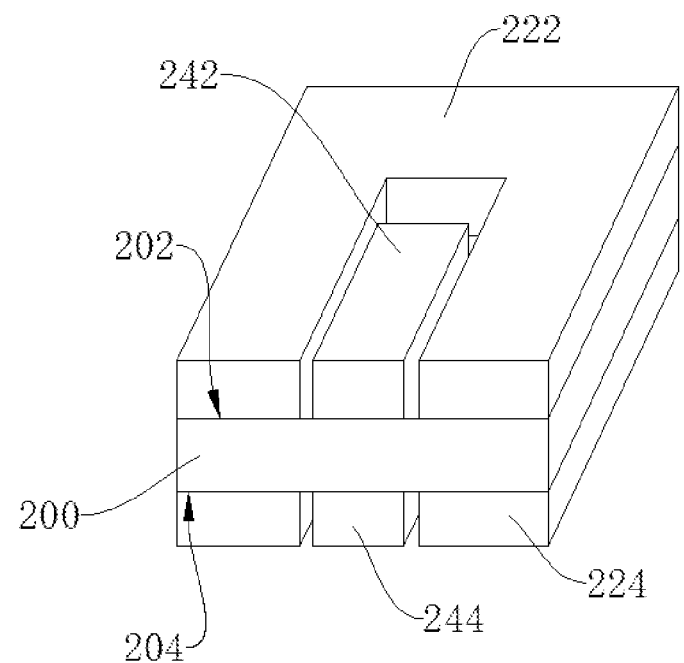
FIG. 5 is a perspective view of the second pixel area of FIG. 4.
Figure 7:
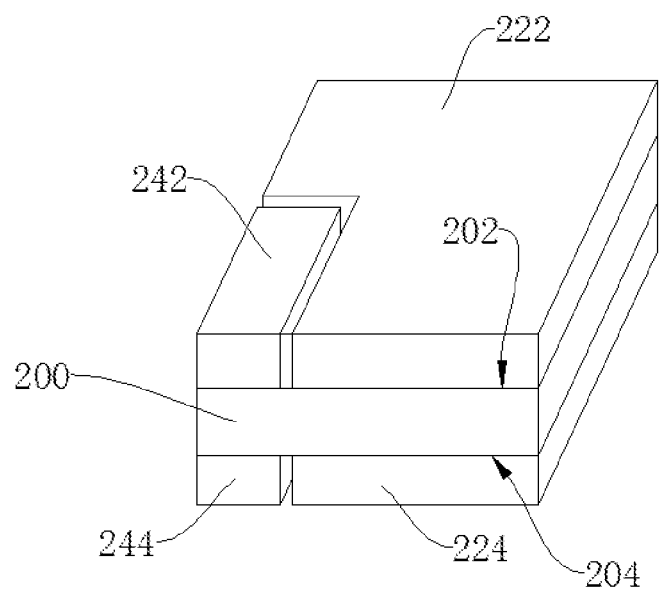
FIG. 7 is a perspective view of the third pixel area of FIG. 6.

Referring to FIGS. 3, 5 and 7 together, in the thickness direction of the OLED display panel 100, the pixel area 50 includes an upper electrode, an organic luminescent layer 200, and a lower electrode, which are sequentially laminated. The upper electrode includes a first cathode 222, the lower electrode includes a first anode 224. The displaying module 122, the second sub-pixel unit 14 and the third sub-pixel unit 16 are formed by laminating the first cathode 222, the organic luminescent layer 200, and the first anode 224. The displaying module 122, the second sub-pixel unit 14 and the third sub-pixel unit 16 are the OLED. The organic luminescent layer 200 includes a first side 202 and a second side 204, which are disposed opposite to each other. The first side 202 and the second side 204 of the organic luminescent layer 200 corresponding to the displaying module 122, the second sub-pixel unit 14 and the third sub-pixel unit 16 are connected to the first cathode 222 and the first anode 224, respectively. Specifically, the organic luminescent layer 200 includes an electron transmission layer, an electron injection layer, a luminescent material layer, a hole injection layer, and a hole transmission layer, which are sequentially laminated, thus forming a P-N junction. In the displaying module 122, the second sub-pixel unit 14, and the third sub-pixel unit 16, the organic luminescent layer 200 is provided with a first cathode 222 and a first anode 224 connecting to the P-N junction in the forward direction on both sides, respectively, so as to emit light and display. The organic luminescent layer 200 emits image light of three primary colors of red, green and blue according to the different ratio of the luminescent material layer.

In one embodiment, the upper electrode further includes a second anode 242, the lower electrode includes a second cathode 244. The light receiving module 124 is formed by laminating the second anode 242, the organic luminescent layer 200, and the second cathode 244. The light receiving module 124 is a photodiode. The first side 202 and the second side 204 of the organic luminescent layer 200 of the light receiving module 124 are connected to the second anode 242 and the second cathode 244, respectively. Polarity of the second anode 242 and the first cathode 222 is reverse, polarity of the second cathode 244 and the first anode 224 is reverse, which enables the P-N junction of the light receiving module 124 to be connected in the reverse direction, thus forming the photodiode producing current when it is subjected to illumination. A first light, a second light, and a third light emitted from the displaying module 122, the first sub-pixel unit 14 and the third sub-pixel unit 16 is received by the light receiving module 124 to recognize the fingerprint. The OLED is a device that coverts a light signal into an electric signal. When the component material of the OLED varies, it can sense different light with particular wavelength. For example, the OLED is made up of the component material that sense red monochromatic light merely, thus by analyzing the intensity of the red monochromatic light emitted from a first display area or the second pixel area 20 or the third pixel area 30 and the intensity of the red monochromatic light received by the light receiving module 124, what the red monochromatic light correspond to the valley or ridge of the fingerprint can be informed.

In one embodiment, a gap is formed between the first cathode 222 and the second anode 242, and a gap is formed between the first anode 224 and the second cathode 244. i.e., the display module 122, the second sub-pixel unit 14, the third sub-pixel unit 16, and the light receiving module 124 are insulated from each other. So as to avoid the voltage exerted by a motherboard exerts an influence on the working of the second cathode 244 and the second anode 242, thus enhancing the fingerprint recognition accuracy of the light receiving module 124.

In the illustrated embodiment, parts of the first cathode 222 corresponding to the displaying module 122, the second sub-pixel unit 14 and the third sub-pixel unit 16 are separated; parts of the first anode 224 corresponding to the displaying module 122 and the second sub-pixel unit 14 and the third sub-pixel unit 16 are separated. Thus, the displaying module 122, the sub-pixel unit 14, and the third sub-pixel unit 16 can be controlled and work, independently. The voltage exerted on the organic luminescent layer corresponding to the displaying module 122, the second sub-pixel unit 14, and the third sub-pixel unit 16 can be changed, independently. Therefore, the intensity variation of the red, green and blue monochromatic light can be controlled independently, and three primary colors of red, green and blue with different intensity can be combined to form the colorful image of different colors.

In the illustrated embodiment, the OLED display panel further includes an filter disposed between the light receiving module 124 and the finger. It can filter out the light getting through the filter and received by the light receiving module 124, which enables the light receiving module 124 to receive the light with the particular wavelength, merely. For example, the filter that being got through by the red monochromatic light is selected, thus by analyzing the intensity of the red monochromatic light emitted from the first display area or the second pixel area 20 or the third pixel area 30 and the intensity of the red monochromatic light received by the light receiving module 124, what the red monochromatic light correspond to the valley or ridge of the fingerprint can be informed. The filter has advantages of lowering the requirement of the device, i.e., it is unnecessary to use the photodiode materials that requires to sense the particular wavelength, therefore reducing the cost of the device.

Figure 8:
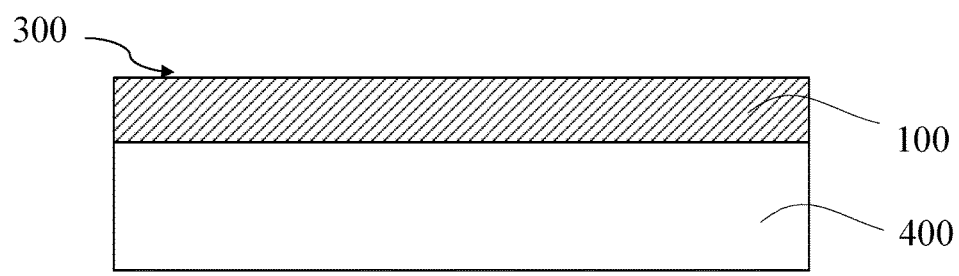
FIG. 8 is a cross-section view of an electronic device according to an embodiment.

Referring to FIG. 8, the present disclosure is also directed to an electronic device 300, the electronic device 300 includes a motherboard 400 and an OLED display panel 100 for fingerprint recognition of above. The motherboard 400 is electronically coupled to the OLED display panel 100 and configured to control the pixel area 50 to display image and to process the fingerprint signal emitted from the sub-pixel unit. When being applied in practice, the electronic device may be a terminal with the OLED panel having the fingerprint recognition in the visible area (display area), the terminal may be a mobile phone, a tablet and so on.

The foregoing implementations are merely specific embodiments of the present disclosure, but are not intended to limit the protection scope of the present disclosure. It should be noted that persons skilled in the art can understand and embody all or part of flowcharts of the above implementations. Equivalent variation figured out by persons skilled in the art shall all fall within the protection scope of the present disclosure.

What is claimed is:
1. An organic light-emitting diode (OLED) display panel for fingerprint recognition, comprising:
   a plurality of sub-pixel units of the same size arranged in arrays, wherein the plurality of sub-pixel units are configured to emit blue, green, and red monochromatic light, which are combined to form a colorful image, three adjacent sub-pixel units are sequentially arranged to form a pixel area;
   wherein in each pixel area, the sub-pixel units emit the monochromatic light of different colors, respectively, and at least one sub-pixel unit comprises:
      a displaying module configured to emit the monochromatic light; and
      a light receiving module configured to receive the monochromatic light reflected by a finger and convert a light signal of the monochromatic light into an electric signal, wherein the pixel area comprises a first pixel area, a second pixel area, and a third pixel area; and wherein each of the first pixel area, the second pixel area, and the third pixel area comprises a first sub-pixel unit, a second sub-pixel unit, and a third sub-pixel unit, which are adjacent to each other, the first sub-pixel unit comprises the displaying module and the light receiving module; wherein displaying area of the displaying module is less than each of the displaying area of the second sub-pixel unit and the third sub-pixel unit.

2. The OLED display panel of claim 1, wherein the displaying module of the first pixel area emits the red monochromatic light, the displaying module of the second pixel area emits the green monochromatic light, the displaying module of the third pixel area emits the blue monochromatic light, and the number of the first pixel area, the second pixel area and the third pixel area are the same.

3. The OLED display panel of claim 1, wherein the first pixel area, the second pixel area, and the third pixel area are sequentially and alternately arranged.

4. The OLED display panel of claim 1, wherein each first pixel area is surrounded by two second pixel areas and two third pixel areas, each second pixel area is surrounded by two first pixel areas and two third pixel areas, and each third pixel area is surrounded by two first pixel areas and two second pixel areas.

5. The OLED display panel of claim 1, wherein the first sub-pixel unit, the second sub-pixel unit, and the third sub-pixel unit are shaped as rectangles of the same size.

6. The OLED display panel of claim 1, wherein the pixel area comprises an upper electrode, an organic luminescent layer, and a lower electrode, which are sequentially laminated; the upper electrode comprises a first cathode and a second anode, the lower electrode comprises a first anode and a second cathode; the displaying module and the remaining sub-pixel units are formed by laminating the first cathode, the organic luminescent layer, and the first anode; and the light receiving module is formed by laminating the second anode, the organic luminescent layer, and the second cathode.

7. The OLED display panel of claim 6, wherein a gap is formed between the first cathode and the second anode, and a gap is formed between the first anode and the second cathode.

8. The OLED display panel of claim 6, wherein the organic luminescent layer comprises a first side and a second side, which are disposed opposite to each other, the first side and the second side corresponding to the displaying module, the second sub-pixel unit and the third sub-pixel unit are connected to the first cathode and the first anode, respectively.

9. The OLED display panel of claim 6, wherein the organic luminescent layer comprises an electron transmission layer, an electron injection layer, a luminescent material layer, a hole injection layer, and a hole transmission layer, which are sequentially laminated.

10. The OLED display panel of claim 6, wherein parts of the first cathode corresponding to the displaying module and the sub-pixel unit are separated, and parts of the first anode corresponding to the displaying module and the sub-pixel unit are separated.

11. The OLED display panel of claim 1, wherein the displaying module is an OLED, and the light receiving module is a photodiode.

12. The OLED display panel of claim 1, further comprising a filter disposed between the light receiving module and the finger.

13. An electronic device, comprising:
an OLED display panel for fingerprint recognition, comprising:
a plurality of sub-pixel units of the same size arranged in arrays, wherein the plurality of sub-pixel units are configured to emit blue, green, and red monochromatic light, which are combined to form a colorful image, three adjacent sub-pixel units are sequentially arranged to form a pixel area;
wherein in each pixel area, the sub-pixel units emit the monochromatic light of different colors, respectively, and at least one sub-pixel unit comprises:
a displaying module configured to emit the monochromatic light; and
a light receiving module configured to receive the monochromatic light reflected by a finger and convert a light signal of the monochromatic light into an electric signal; and
a motherboard electrically coupled to the OLED display panel, wherein the motherboard is configured to control the pixel area to display image and process the electric signal,
wherein the pixel area comprises an upper electrode, an organic luminescent layer, and a lower electrode, which are sequentially laminated; the upper electrode comprises a first cathode and a second anode, the lower electrode comprises a first anode and a second cathode; the displaying module and the remaining sub-pixel units are formed by laminating the first cathode, the organic luminescent layer, and the first anode; and the light receiving module is formed by laminating the second anode, the organic luminescent layer, and the second cathode.

14. The electronic device of claim 13, wherein the pixel area comprises a first pixel area, a second pixel area and a third pixel area; the displaying module of the first pixel area emits the red monochromatic light, the displaying module of the second pixel area emits the green monochromatic light, the displaying module of the third pixel area emits the blue monochromatic light, and the number of the first pixel area, the second pixel area and the third pixel area are the same.

15. The electronic device of claim 14, wherein first pixel area, the second pixel area and the third pixel area are sequentially and alternately arranged.

16. The electronic device of claim 14, wherein each first pixel area is surrounded by two second pixel areas and two third pixel areas, each second pixel area is surrounded by two first pixel areas and two third pixel areas, and each third pixel area is surrounded by two first pixel areas and two second pixel areas.

17. The electronic device of claim 14, wherein each of the first pixel area, the second pixel area, and the third pixel area comprises a first sub-pixel unit, a second sub-pixel unit, and a third sub-pixel unit, which are adjacent to each other, the first sub-pixel unit comprises the displaying module and the light receiving module, which are connected to each other, and the first sub-pixel unit, the second sub-pixel unit, and the third sub-pixel unit are shaped as rectangles of the same size.

18. The electronic device of claim 17, wherein displaying area of the displaying module is smaller than each of the displaying area of the second sub-pixel unit and the third sub-pixel unit.

* * * * *